US010218258B1

(12) United States Patent
Nagl et al.

(10) Patent No.: US 10,218,258 B1
(45) Date of Patent: Feb. 26, 2019

(54) APPARATUS AND METHOD FOR DRIVING A POWER STAGE

(71) Applicant: Dialog Semiconductor (UK) Limited, London (GB)

(72) Inventors: Christoph N. Nagl, Graz (AT); Horst Knoedgen, Munich (DE); Nebojsa Jelaca, Graz (AT)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/865,802

(22) Filed: Jan. 9, 2018

(51) Int. Cl.
| | | |
|---|---|---|
| *H02M 1/088* | (2006.01) |
| *H02M 1/08* | (2006.01) |
| *H02M 1/38* | (2007.01) |
| *H02M 3/158* | (2006.01) |
| *H02M 1/00* | (2006.01) |

(52) U.S. Cl.
CPC ........... *H02M 1/088* (2013.01); *H02M 1/083* (2013.01); *H02M 1/38* (2013.01); *H02M 3/1588* (2013.01); *H02M 2001/0058* (2013.01)

(58) Field of Classification Search
CPC . H02M 2001/0054; H02M 2001/0058; H02M 1/08; H02M 1/083; H02M 1/088; H02M 1/096; H02M 3/155; H02M 3/156; H02M 3/1588
See application file for complete search history.

(56) References Cited

U.S. PATENT DOCUMENTS

| | | | | |
|---|---|---|---|---|
| 8,804,382 B2* | 8/2014 | Stone | ...................... | H02M 1/36 363/127 |
| 2001/0030880 A1* | 10/2001 | Miyazaki | ........... | H03K 17/0822 363/98 |
| 2005/0128776 A1* | 6/2005 | Dequina | ............... | H02M 1/088 363/89 |
| 2008/0018366 A1* | 1/2008 | Hanna | ..................... | H02M 1/08 327/112 |
| 2008/0290854 A1* | 11/2008 | Uchiike | .............. | H02M 3/1588 323/284 |
| 2009/0027024 A1* | 1/2009 | Dequina | .................. | H02M 1/38 323/283 |
| 2009/0295350 A1* | 12/2009 | Yamada | .............. | H02M 3/1588 323/282 |
| 2014/0055190 A1* | 2/2014 | Kaneko | ................... | H02M 1/08 327/376 |

(Continued)

*Primary Examiner* — Fred E Finch, III
(74) *Attorney, Agent, or Firm* — Saile Ackerman LLC; Stephen B. Ackerman

(57) ABSTRACT

A method and apparatus for driving a power stage is presented. In particular, the power stage is a half-bridge. In the method, there is a first power switch coupled to a second power switch via a switching node. The method steps include sensing a first control-terminal voltage of one of the first power switch and the second power switch and turning on the first power switch based on the first control-terminal voltage and sensing a second control-terminal voltage of one of the first power switch and the second power switch and turning on the second power switch based on the second control-terminal voltage. Optionally, the first power switch is turned on when the first control-terminal voltage has reached a first threshold value, and the second power switch is turned on when the second control-terminal voltage has reached a second threshold value.

23 Claims, 9 Drawing Sheets

(56) References Cited

U.S. PATENT DOCUMENTS

| | | | | |
|---|---|---|---|---|
| 2014/0145658 A1* | 5/2014 | Heo | ............... | H02P 6/14 |
| | | | | 318/400.26 |
| 2014/0300329 A1* | 10/2014 | Thompson | ............ | H03K 5/1536 |
| | | | | 323/235 |
| 2015/0194890 A1* | 7/2015 | Dalena | ................ | H03K 17/122 |
| | | | | 323/271 |
| 2015/0214829 A1* | 7/2015 | Xu | ................. | H02M 1/083 |
| | | | | 363/21.03 |
| 2016/0079785 A1* | 3/2016 | Kinzer | ................ | H02J 7/0052 |
| | | | | 320/107 |
| 2016/0352320 A1* | 12/2016 | Nagase | ................ | H02M 1/32 |
| 2017/0093296 A1* | 3/2017 | Chen | ................ | H02M 1/088 |
| 2017/0126121 A1* | 5/2017 | Wang | ................ | H02M 3/158 |
| 2017/0237332 A1* | 8/2017 | Takahashi | ............ | H02M 1/083 |
| | | | | 323/235 |
| 2018/0013416 A1* | 1/2018 | Sicard | ................ | H01L 29/7393 |
| 2018/0034456 A1* | 2/2018 | Lee | ................. | H01L 23/64 |

\* cited by examiner

APPARATUS AND METHOD FOR DRIVING A POWER STAGE

TECHNICAL FIELD

The present disclosure relates to a method and apparatus for driving a power stage. In particular, the present disclosure relates to an apparatus and method for driving a half-bridge.

BACKGROUND

Switched-mode power supplies such as buck or buck-boost converters operate based on the cyclic charge and discharge of an inductor. The control of the charge and discharge phase often relies on a pair of power switches, a high-side power switch being used for charging the inductor and a low-side power switch being used for discharging it. Such systems rely on a careful timing operation of the switches; when one power switch is open the other is closed and vice versa. To avoid the occurrence of potential short circuits, a delay, also referred to as dead-time, may be introduced between the switching of the high-side power switch and the switching of the low-side power switch.

To minimize power losses and improve signal noise, switched-mode power supplies may be operated in a so-called resonant mode also referred to as zero-voltage mode. Operating the converter in resonant mode requires careful determination of the time at which the conductive state of the switches should be changed. This may be achieved by measuring the drain to source voltage of the low-side power switch corresponding to the voltage at the switching node. This requires a resistive voltage divider, or an auxiliary winding coupled with the primary winding of the converter. The measured voltage at the switching node is then used to detect the minimum drain voltage. The information is then processed with control logic to determine at what time to operate the power switches.

Such systems require external components which increase the cost and complexity of the device and limit its power efficiency.

SUMMARY

It is an object of the disclosure to address one or more of the above-mentioned limitations. According to a first aspect of the disclosure, there is provided a method of driving a power stage comprising a first power switch coupled to a second power switch via a switching node; the method comprising sensing a first control-terminal voltage of one of the first power switch and the second power switch and turning on the first power switch based on the first control-terminal voltage; sensing a second control-terminal voltage of one of the first power switch and the second power switch and turning on the second power switch based on the second control-terminal voltage.

For example, the first control-terminal voltage may be a voltage at a control terminal of the first power switch; and the second control-terminal voltage may be a voltage at a control-terminal of the second power switch. Alternatively, the first control-terminal voltage may be a voltage at a control terminal of the second power switch; and the second control-terminal voltage may be a voltage at a control-terminal of the first power switch. For instance, the control-terminal voltage may be a gate voltage.

Optionally, the first power switch is turned on when the first control-terminal voltage has reached a first threshold value; and the second power switch is turned on when the second control-terminal voltage has reached a second threshold value.

Optionally, the method comprises comparing the first control-terminal voltage with a first reference value; and generating a first control signal based on the comparison to turn on the first power switch; comparing the second control-terminal voltage with a second reference value; and generating a second control signal based on the comparison to turn on the second power switch.

For example, the first reference value may be selected to identify a decrease in the first control-terminal voltage beyond the first threshold value. Similarly, the second reference value may be selected to identify a decrease in the second control-terminal voltage beyond the second threshold value.

Optionally, the first power switch comprises a first parasitic capacitor associated with a first parasitic current, and the second power switch comprises a second parasitic capacitor associated with a second parasitic current.

Optionally, the first control-terminal voltage is a function of the first parasitic current or the second parasitic current; and the second control-terminal voltage is a function of the first parasitic current or the second parasitic current.

Optionally, the switching node has a switching voltage; and the first and second parasitic currents are function of a time derivative of the switching voltage.

For example, the sign (positive or negative) of a parasitic current may change depending on whether the time derivative of the switching voltage is positive or negative. For instance, when the time derivative of the switching voltage is positive, the parasitic current may be negative; and when the time derivative of the switching voltage is negative, the parasitic current may be positive. Alternatively, when the time derivative of the switching voltage is positive, the parasitic current may be positive; and when the time derivative of the switching voltage is negative, the parasitic current may be negative.

Optionally, the switching voltage varies between a first value and a second value during a transient period; and wherein the first control-terminal voltage and the second control-terminal voltage are sensed at some point during the transient period.

According to a second aspect of the disclosure there is provided a driver for use with a power stage, the power stage comprising a first power switch coupled to a second power switch via a switching node; the driver being adapted to sense a first control-terminal voltage of one of the first power switch and the second power switch, to sense a second control-terminal voltage of one of the first power switch and the second power switch, and to turn on the first power switch based on the first control-terminal voltage, and to turn on the second power switch based on the second control-terminal voltage.

Optionally, the driver is adapted to turn on the first power switch when the first control-terminal voltage has reached a first threshold value; and to turn on the second power switch when the second control-terminal voltage has reached a second threshold value.

Optionally, the first power switch comprises a first parasitic capacitor associated with a first parasitic current; and the second power switch comprises a second parasitic capacitor associated with a second parasitic current.

Optionally, the first control-terminal voltage is a function of the first parasitic current or the second parasitic current; and the second control-terminal voltage is a function of the first parasitic current or the second parasitic current.

Optionally, the switching node has a switching voltage; wherein the first and second parasitic currents are function of a time derivative of the switching voltage. For example, the sign (positive or negative) of a parasitic current may change depending on whether the time derivative of the switching voltage is positive or negative.

Optionally, the driver comprises a first comparator to compare the first control-terminal voltage with a first reference and to provide a first comparison signal; a second comparator to compare the second control-terminal voltage with a second reference and to provide a second comparison signal; a controller coupled to the first comparator and the second comparator; the controller being adapted to provide a first control signal to turn the first power switch on and a second control signal to turn the second power switch on; wherein the first control signal is based on the first comparison signal; and wherein the second control signal is based on the second comparison signal.

For example, the first reference may be selected to identify a decrease in the first control-terminal voltage beyond the first threshold value. Similarly, the second reference may be selected to identify a decrease in the second control-terminal voltage beyond the second threshold value.

Optionally, the switching node has a switching voltage, the switching voltage increasing from a first value to a second value during a first transient period, and decreasing from the second value to the first value during a second transient period; and wherein the first comparator compares the first control-terminal voltage with the first reference voltage at some point during the first transient period; and wherein the second comparator compares the second control-terminal voltage with the second reference voltage at some point during the second transient period.

Optionally, the first comparator comprises a first transistor coupled to the first reference; and wherein the second comparator comprises a second transistor coupled to the second reference.

Optionally, the first comparator is coupled to a first sensing resistor, and wherein the second comparator is coupled to a second sensing resistor.

Optionally, the first sensing resistor is provided between the switching node and a control-terminal terminal of the first power switch; and the second sensing resistor is provided between a ground terminal and a control-terminal terminal of the second power switch.

According to a third aspect of the disclosure, there is provided a power circuit comprising a power stage, the power stage comprising a first power switch coupled to a second power switch via a switching node; and a driver, the driver being adapted to sense a first control-terminal voltage of one of the first power switch and the second power switch, and a second control-terminal voltage of one of the first power switch and the second power switch, and to turn on the first power switch based on the first control-terminal voltage, and to turn on the second power switch based on the second control-terminal voltage.

Optionally, the power circuit is made at least in part based on a III/V semiconductor. For example, the first power switch and the second power switch of the power stage may be GaN transistors.

Optionally, the first power switch comprises a first parasitic capacitor associated with a first parasitic current, and the second power switch comprises a second parasitic capacitor associated with a second parasitic current.

Optionally, the first control-terminal voltage is a function of the first parasitic current or the second parasitic current; and the second control-terminal voltage is a function of the first parasitic current or the second parasitic current.

Optionally, the switching node has a switching voltage; and the first and second parasitic currents are function of a time derivative of the switching voltage.

Optionally, the driver comprises a first comparator to compare the first control-terminal voltage with a first reference and to provide a first comparison signal; a second comparator to compare the second control-terminal voltage with a second reference and to provide a second comparison signal; a controller coupled to the first comparator and the second comparator; the controller being adapted to provide a first control signal to turn the first power switch on and a second control signal to turn the second power switch on; wherein the first control signal is based on the first comparison signal; and wherein the second control signal is based on the second comparison signal.

Optionally, the switching node has a switching voltage, the switching voltage increasing from a first value to a second value during a first transient period, and decreasing from the second value to the first value during a second transient period; and wherein the first comparator is adapted to compare the first control-terminal voltage with the first reference at some point during the first transient period; and wherein the second comparator is adapted to compare the second control-terminal voltage with the second reference at some point during the second transient period.

The power circuit according to the third aspect of the disclosure may comprise any of the features described above in relation to the driver according to the second aspect of the disclosure.

BRIEF DESCRIPTION OF THE DRAWINGS

The disclosure is described in further detail below by way of example and with reference to the accompanying drawings, in which.

DESCRIPTION

Figure 1:
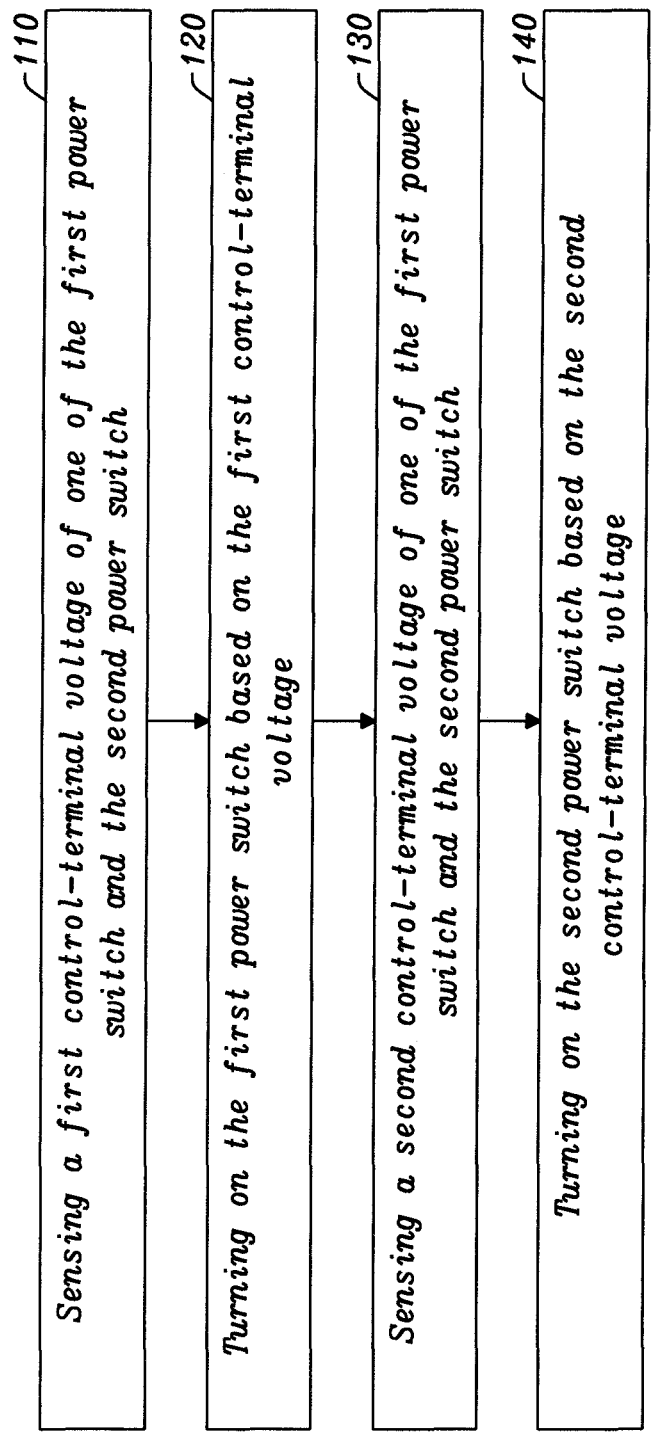
FIG. 1 is a flow chart of a method for driving a power stage.

FIG. 1 is a flow chart of a method for driving a power stage. The power stage includes a first power switch coupled to a second power switch via a switching node, and may be referred to as a half-bridge.

At step 110, a first control-terminal voltage of one of the first power switch and the second power switch is sensed. At step 120 the first power switch is turned on based on the first control-terminal voltage. At step 130 a second control-terminal voltage of one of the first power switch and the second power switch is sensed. At step 140, the second power switch is turned on based on the second control-terminal voltage.

For example, the first and second power switches may be provided by a power transistor having a gate terminal. The first control-terminal voltage may be a gate voltage at the gate terminal of the first power transistor and the second control-terminal voltage a gate voltage at the gate terminal of the second power transistor. For instance, the first power transistor may be turned on when the gate voltage of the first power transistor has reached a first threshold value. Similarly, the second power transistor may be turned on when the gate voltage of the second power transistor has reached a second threshold value.

Figure 2:
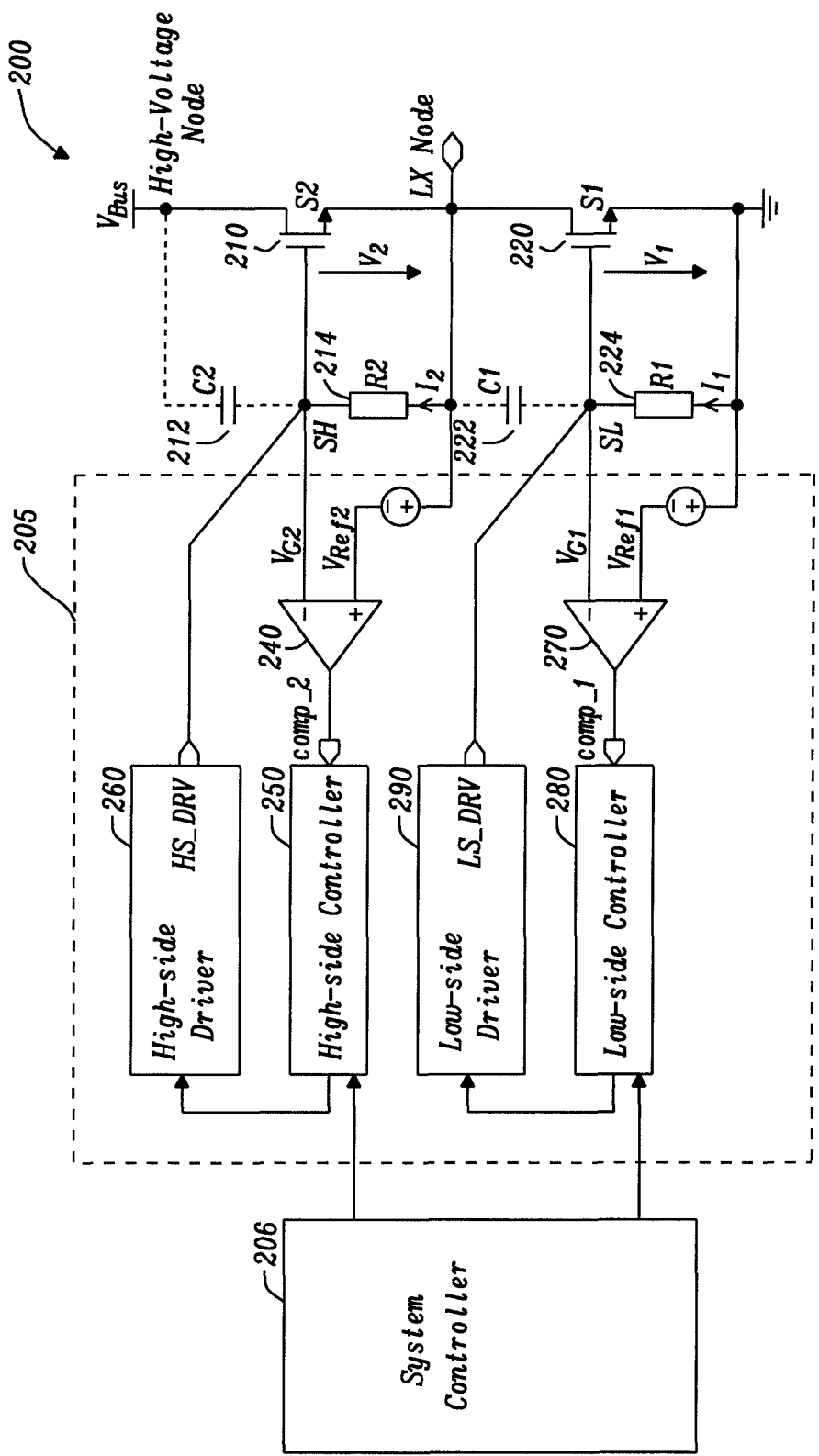
FIG. 2 is a diagram of a power circuit.

FIG. 2 illustrates a power circuit 200 that includes a driver 205 coupled to a power stage formed by a high-side power switch S2 210 coupled to a low-side power switch S1 220 via a switching node LX.

The high-side power switch 210, has a first terminal, for example a drain terminal coupled to a high voltage node, a second terminal, for example a gate terminal coupled to a high-side sensing node SH, and a third terminal for example a source terminal coupled to the switching node LX. A voltage Vbus is provided at the high voltage node. The high-side power switch 210 also includes a parasitic capacitor C2 212 between the gate terminal and the drain terminal. The parasitic capacitor C2 has a gate-drive capacitance $C_{GD}$, also referred to as Miller capacitance.

The low-side power switch 220, has a first terminal, for example a drain terminal coupled to the switching node LX, a second terminal, for example a gate terminal coupled to a low-side sensing node SL, and a third terminal for example a source terminal coupled to the ground. The low-side power switch 220 also includes a parasitic capacitor C1 222 between the gate terminal and the drain terminal. The parasitic capacitor C1 has a gate-drive capacitance $C_{GD}$, also referred to as Miller capacitance.

A first resistance R1 224 is provided between the ground and the low-side sensing node SL. A second resistance R2 214 is provided between the switching node LX and the high-side sensing node SH. The resistances R1 and R2 may be referred to as sensing resistances, as they are used to measure the voltage at the low-side sensing node SL and the high-side sensing node respectively.

The driver 205 includes a high-side circuit for operating the high-side switch S2 210 and a low-side circuit for operating the low-side switch S1 220. The high-side circuit is formed by a high-side comparator 240, a high-side controller 250 and a high-side driver 260. The comparator 240 has a first input, for example an inverting input coupled to the high-side sensing node SH, a second input, for example a non-inverting input coupled to a reference voltage Vref2, and an output for providing a comparator signal labelled comp_2. The high-side controller 250 has an input for receiving the output signal from the comparator 240, and an output for providing a control signal. The high-side driver 260 has an input for receiving the control signal from the high-side controller 250, and an output for providing a drive signal HS_DRV to the high-side power switch 210 at node SH.

The low-side circuit is formed by a low-side comparator 270, a low-side controller 280 and a low-side driver 290. The comparator 270 has a first input, for example an inverting input coupled to the low-side sensing node SL, a second input, for example a non-inverting input coupled to a reference voltage Vref1, and an output for providing a comparator output signal labelled comp_1. The low-side controller 280 has an input for receiving the output signal from the comparator 270, and an output for providing a control signal. The low-side driver 290 has an input for receiving the control signal from the low-side controller 280, and an output for providing a drive signal LS_DRV to the low-side power switch 220 at node SL.

The voltage references Vref1 and Vref2 are chosen to detect the voltage drop in the gate voltages $V_{G1}$ or $V_{G2}$, also referred to as ditches, caused by voltage variations at the switching node. The value of the reference voltage may be adjusted to account for different variables. For example, the reference voltage may depend on the Miller capacitance, the rate of change of the voltage at the switching node, and the value of the sense resistor.

A system controller 206 may be provided to turn off the high-side power switch 210 or the low-side power switch 220. The system controller 206 is coupled to the high-side controller 250 and to the low-side controller 280.

The different components forming the driver 205 may be arranged and combined according to different configurations. For example, the high-side controller 250 and the low-side controller 280 may be combined in a single controller. The high-side driver 260 may be integrated as part of the high-side controller 250. Similarly, the low-side driver 290 may be integrated as part of the low-side controller 280.

In operation, the parasitic capacitor C1 222 causes a first Miller current I1 to flow between the ground and the gate of the low-side power switch 220 when the drain-source potential of the low-side power switch 220 is changed. Similarly, the parasitic capacitor C2 212 causes a second Miller current I2 to flow between the switching node LX and the gate of the high-side power switch 210 when the drain-source potential of the high-side transistor 210 is changed. The currents I1 and I2 may change direction and therefore be either positive or negative. FIG. 2 shows the defined direction of a positive current I1 and a positive current I2.

The voltage at the switching node LX varies during so called transient periods. During a transient period, the current I1 and I2 through the capacitors C1 and C2 will drive the gate voltages $V_{G1}$ and $V_{G2}$ via the resistors R1 and R2 for the low-side switch S1 and the high-side switch S2 respectively. The voltages $V_{G1}$ and $V_{G}2$ can then be detected by the comparators 270 and 240 respectively.

The direction of the Miller current I2 depends on the sign of the derivative of the voltage $V_{LX}$. The Miller current causes a change in the gate voltage $V_{G2}$, which can be detected by the comparator 240. This allows the identification of the beginning and the end of the switching transient, irrespective of the voltage at the drain terminal of the power switch.

The gate voltage $V_{G2}$ may be expressed as a function of the Miller current I2 as follows:

$$V_{G2}=V_{LX}-R_2 \cdot I_2 \qquad (1)$$

The Miller current I2 is a function of the derivative of the voltage $V_{LX}$. When the derivative $dV_{LX}/dt$ is positive, the Miller current I2 is positive and flows from the switching node LX to the gate of the high-side switch 210. The voltage $V_2=R_2*I_2$ across R2 is positive, and $V_{G2}$ decreases. When the derivative $dV_{LX}/dt$ is negative, the Miller current I2 is negative and flows from the gate of the high-side switch 210 to the LX node. The voltage $V_2$ across R2 is negative, and $V_{G2}$ increases. When the derivative $dV_{LX}/dt$ is null, the Miller current I2 is null.

Similarly, the parasitic capacitor C1 causes a Miller current I1 to flow between the switching node LX and the sensing node SH when the drain-source potential of the low-side transistor 220 is changed. The gate voltage $V_{G1}$ may be expressed as a function of the Miller current I1 as follows:

$$V_{G1} = -R_1 \cdot I_1 \quad (2)$$

When the derivative $dV_{LX}/dt$ is positive, the Miller current I1 is negative and flows from ground to the gate of the low-side switch 220. The voltage $V_1$ across R1 is negative, and $V_{G1}$ increases. When the derivative $dV_{LX}/dt$ is negative, the Miller current I1 is positive and flows from the gate of the low-side switch 220 to ground. The voltage $V_1$ across R1 is positive, and $V_{G1}$ decreases.

By detecting the end of a switching transient, subsequent switching operation can be triggered with minimum delay, while at the same time avoiding short circuit, and maintaining safe operation. This permits to operate the power stage at higher switching frequencies. This approach also avoids hard-switching which ensure the device safety and improves its lifetime.

Figure 3:
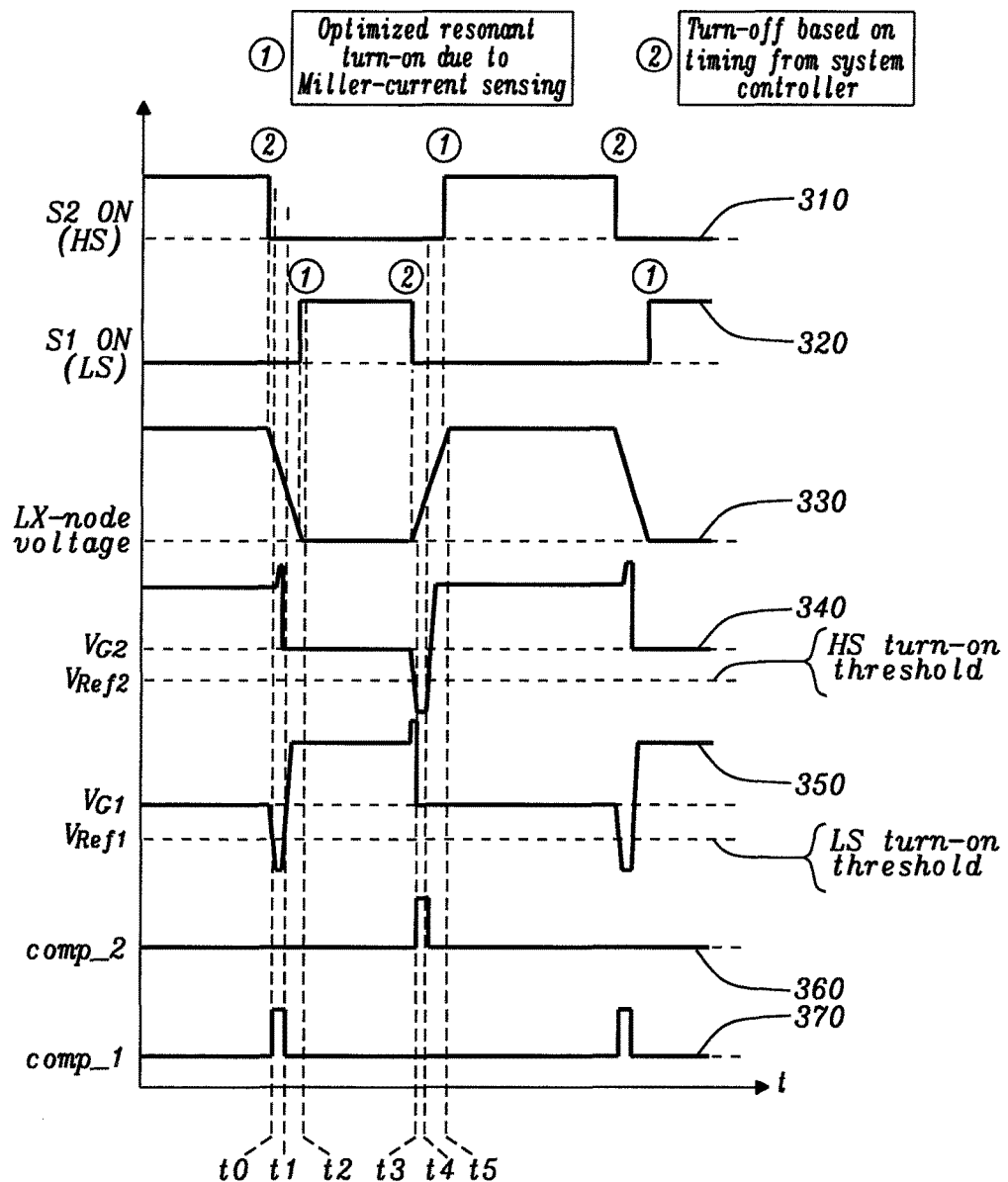
FIG. 3 is a timing diagram illustrating the working of the circuit of FIG. 2.

FIG. 3 shows the state 310 on or off, of the high-side power switch 210; the state 320 on or off, of the low-side power switch 220; the voltage 330 at the switching node; the gate voltage $V_{G2}$ 340 at the high-side sensing node; the gate voltage 350 at the low-side sensing node; the signal comp_2 360 provided by the high-side comparator 240; and the signal comp_1 370 provided by the low-side comparator 270.

The timing for turning off the high-side power switch 210 or the low-side power switch 220 is provided by a system controller. However, the timing for turning on the high-side power switch 210 or the low-side power switch 220 is provided by the driver 205, based on the comparator signals comp_2 and comp_1 provided by the comparators 240 and 270 respectively.

Before time t0, the high-side power switch is on (closed) and the low-side power switch is off (open). The voltage at the switching node is high and remains substantially constant. The Miller currents I1 and I2 are null.

At time t0, the high-side power switch 210 turns off, the switching node voltage 330 start decreasing. The Miller current I1 is positive and the Miller current I2 is negative. The voltage $V_{G1}$ 350 decreases while the voltage $V_{G2}$ 340 increases.

At time t1, the voltage $V_G 1$ is less than the reference voltage Vref1. The comparator signal 370 goes from low to high, and the low-side driver 290 provides a drive signal to turn on the low-side power switch 220, which turn on at time t2.

Between t2 and t3, the voltage at the switching node is low and remains substantially constant. The Miller currents I1 and I2 are null.

At time t3, the low-side power switch 220 turns off, the switching node voltage 330 starts increasing. The Miller current I1 is negative, and the Miller current I2 is positive. The voltage $V_{G1}$ 350 increases while the voltage $V_{G2}$ 340 decreases.

At time t4, the voltage $V_{G2}$ is less than the reference voltage Vref2. The comparator output signal 360 goes from low to high, and the high-side driver 260 provides a drive signal to turn on the high-side power switch, which turns on at time t5.

The time duration between the times t0 and t2 or the times t3 and t5, may be referred to as transient periods. During a first transient period between the times t0 and t2, the voltage at the switching node decreases from a first voltage level to a second voltage level. During a second transient period between the times t3 and t5, the voltage at the switching node increases from the second voltage level to the first voltage level.

The high-side controller 250 and the low-side controller 280 may be adapted to process the comparator signals comp_1 and comp_2 respectively. Each controller can generate a control signal based on the comparator signal. The comparator signals comp_1 and comp_2 may also be used as references to perform other task in the circuit.

Figure 4:
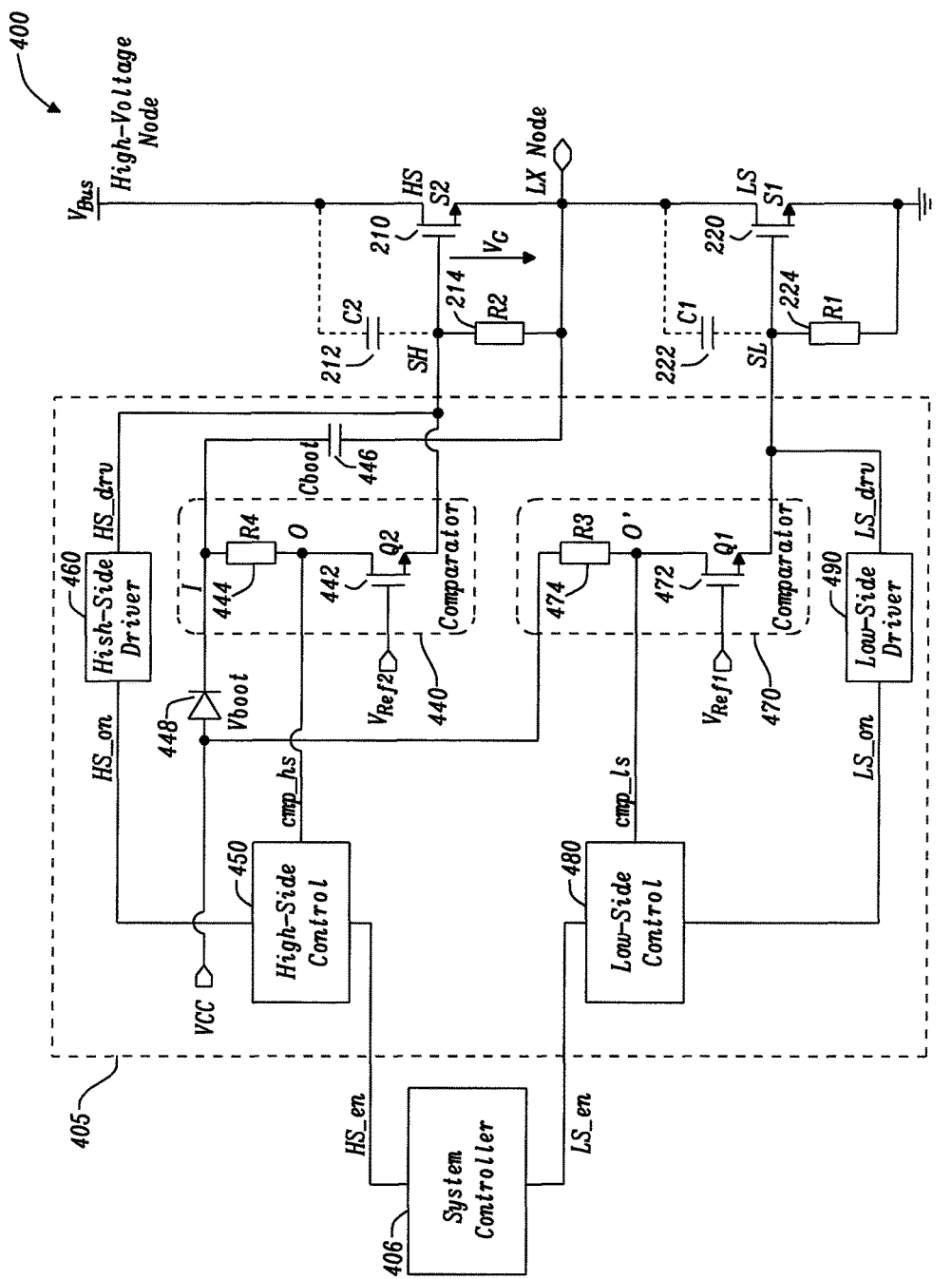
FIG. 4 is a diagram of an exemplary embodiment of the circuit of FIG. 2.

FIG. 4 illustrates an exemplary embodiment of the circuit of FIG. 2. FIG. 4 shares many similar components to those illustrated in FIG. 2, so the same reference numerals have been used to represent corresponding components and their description will not be repeated for sake of brevity.

The power circuit 400 includes a driver 405 coupled to a power stage. The driver 405 includes a comparator 440 formed by a transistor Q2 442 coupled to a resistor R4 444. The resistor 444 has a first terminal coupled to a diode 448 at an input node I and a second terminal coupled to the transistor Q2 442 at an output node O. The diode 448 has a first terminal coupled to a rail voltage Vcc and a second terminal coupled to the resistance R4 444 at node I. The transistor 442 has a drain terminal coupled to the resistor R4, a gate terminal coupled to a reference voltage Vref2, and a source terminal coupled to the gate terminal of the high-side power switch 210 at node SH. The resistance R4 444 is coupled to the switching node LX via a boot capacitor 446 at node I. The output of the comparator 440 is coupled to a high-side controller 450 for providing a control signal to a high-side driver 460. The high-side driver 460 is adapted to provide a drive signal to the high-side power switch 210. The comparator 440 is used to detect the voltage across the resistor R2 214 and to provides a comparator signal cmp_hs to the high-side controller 450. The comparator signal may be further processed, for instance using digital logic.

The driver 405 also includes another comparator 470 formed by a transistor Q1 472 coupled to a resistor R3 474. The resistor 474 has a first terminal coupled to the rail voltage Vcc and a second terminal coupled to the transistor Q1 472 at an output node O'. The transistor 472 has a drain terminal coupled to the resistor R3, a gate terminal coupled to a reference voltage Vref1, and a source terminal coupled to the gate terminal of the low-side power switch 220 at node SL. The output of the comparator 470 is coupled to a low-side controller 480 for providing a control signal to a low-side driver 490. The low-side driver 490 is adapted to provide a drive signal to the low-side power switch 220. The comparator 470 is used to detect the voltage across the resistor R1 224 and to provides a comparator signal cmp_ls to the low-side controller 480. The comparator signal may be further processed, for instance using digital logic.

A system controller 406 is coupled to the high-side controller 450 and to the low-side controller 480. The system controller may be adapted to provide a pair of signals HS_en and LS_en to the high-side controller and to the low-side controller 480 respectively. Such signals may be used to turn off the high-side power switch and the low-side power switch off.

Figure 5:
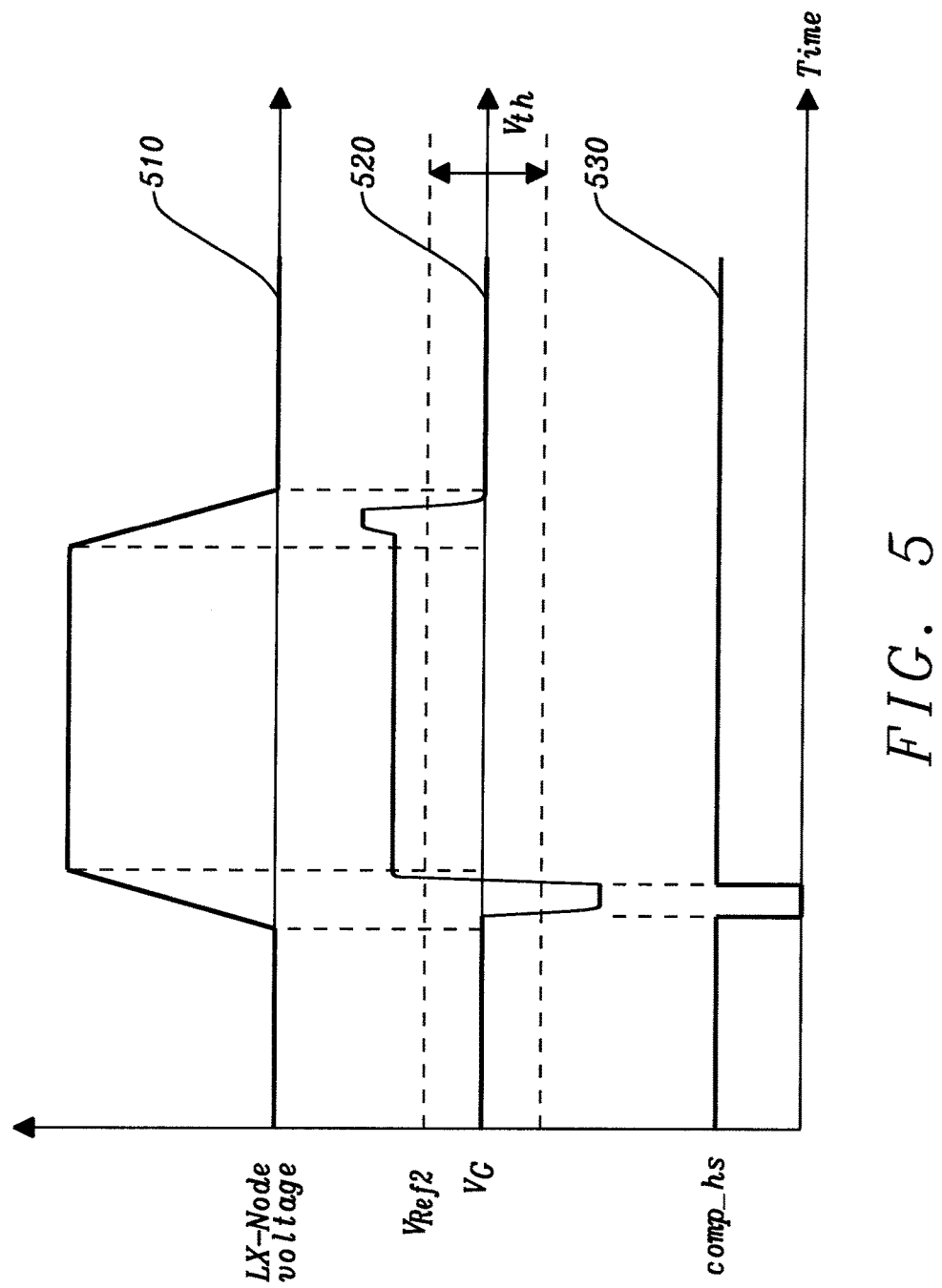
FIG. 5 is a timing diagram illustrating the working of the circuit of FIG. 4.

FIG. 5 is a time chart illustrating the working of the circuit of FIG. 4. The time chart shows the voltage $V_{LX}$ 510 at the switching node, the gate voltage 520, $V_G$ of the high-side power switch 210, and the output voltage 530 of the comparator 440, also referred to as comparator signal. The reference voltage Vref2 may be chosen equal to the threshold voltage Vth of transistor Q2 442.

Figure 6:
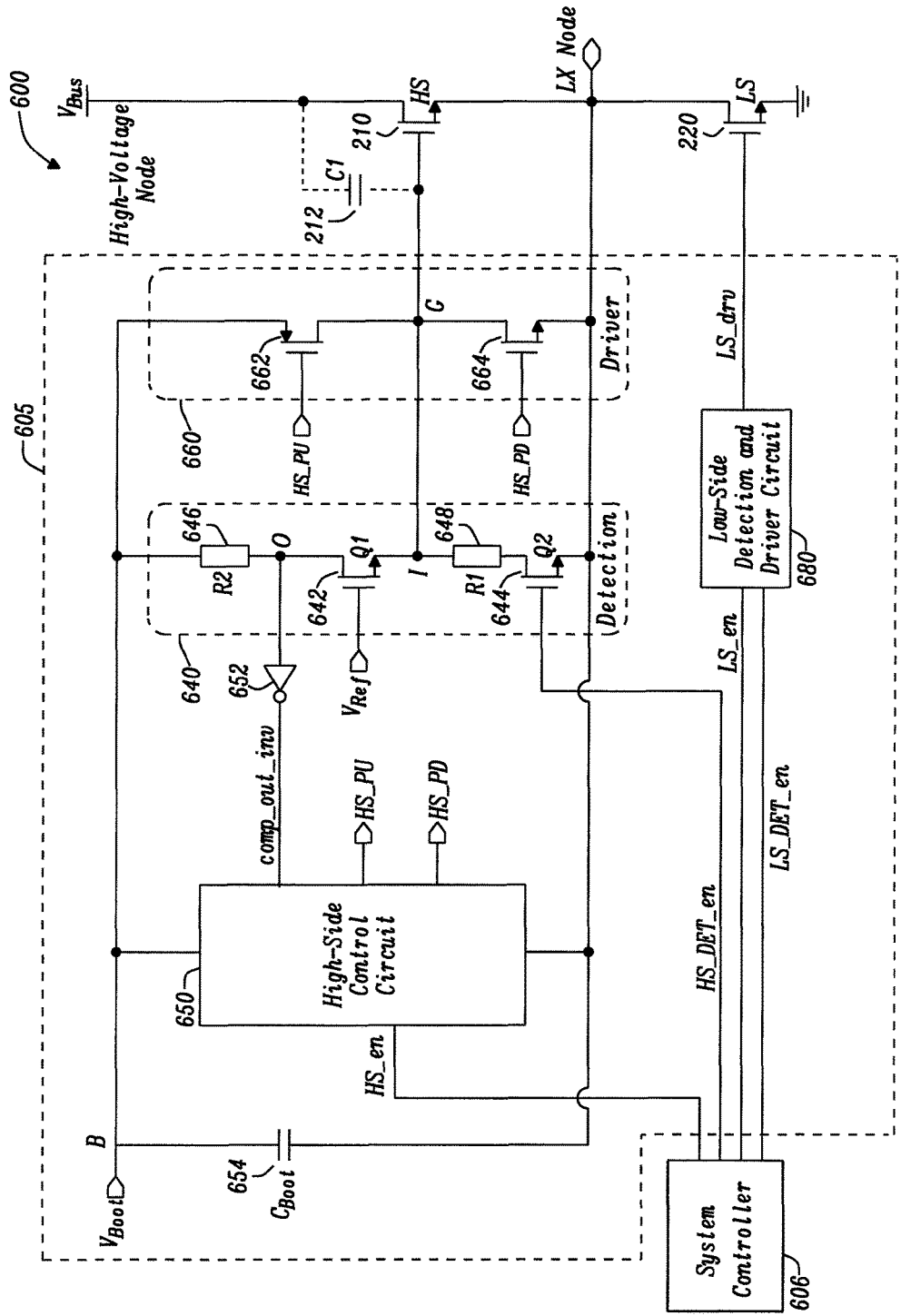
FIG. 6 is a diagram of another exemplary embodiment of the circuit of FIG. 2.

FIG. 6 illustrates another exemplary embodiment of the circuit of FIG. 2. FIG. 6 shares many similar components to those illustrated in FIG. 2, so the same reference numerals have been used to represent corresponding components and their description will not be repeated for sake of brevity. The power circuit 600 includes a driver 605 coupled to a power stage.

The driver 605 includes a high-side circuit for operating the high-side switch 210 and a low-side circuit for operating the low-side switch 220. The high-side circuit is formed by a high-side comparator 640, a high-side controller 650 and a high-side driver 660. The comparator 640 includes a first transistor Q1 642 coupled to a second transistor Q2 644.

The transistor Q1 642 has a drain terminal coupled to a resistor R3 646, a gate terminal coupled to a reference voltage Vref, and a source terminal coupled to the gate terminal of the high-side power switch 210 at an input node I. The resistance R3 646 is coupled to a voltage Vboot.

The transistor Q2 644 has a drain terminal coupled to a resistor R2 648, a gate terminal for receiving a signal HS_DET_EN, and a source terminal coupled to the switching node. The resistance R2 648 is coupled to the source terminal of the transistor Q1 642 at node I.

The output of the comparator 640 is coupled to the high-side controller 650. Optionally, an inverter 652 may be provided between the comparator 640 and the controller 650 to invert the comparator signal. The high-side controller 650 is coupled to Vboot at node B and to Vlx at the switching node LX. The high-side controller 650 has an input for receiving the comparator output signal comp_out_inv, and two outputs for providing a pair of control signals HS_PU and HS_PD to the driver 660.

The high-side driver 660 includes a pull-up transistor 662 coupled to a pull-down transistor 664 at node G. The pull-up transistor 662 has a gate terminal for receiving the control signal HS_PU from the controller 650; a drain terminal coupled to node G; and a source terminal coupled to the boot voltage Vboot at node B. The pull-down transistor 664 has a gate terminal for receiving the control signal HS_PD from the controller 650; a drain terminal coupled to node G; and a source terminal coupled to the switching node LX. A boot capacitor Cboot 654 is provided between node B and the switching node LX.

The low-side circuit 680 is formed by a low-side comparator, a low-side controller and a low-side driver. The low-side comparator and the low-side driver may be implemented in the fashion as the high-side comparator 640 and the high-side driver 660.

A system controller 606 may be coupled to the high-side circuit and to the low-side circuit. In this example, the system controller 606 is adapted to provide a first pair of signal HS_en and LS_en to the high-side controller and low-side controller respectively. The system controller 606 is also adapted to provide a second pair of detection enabling signals HS_DET_en and LS_DET_en to the high-side comparator and to the low-side comparator respectively.

For instance, the high-side detection enable signal HS_DET_en may be used to turn on the transistor Q2 644. The high-side driver circuit may be used to disable the transistor Q2. In an alternative embodiment the detection enabling signals may be provided by another component of the circuit.

The detection of the power switch gate voltage can be integrated monolithically as part of the gate drive circuit. This reduces the number of external components which may be required to determine the time for switching the power switch on.

Figure 7:
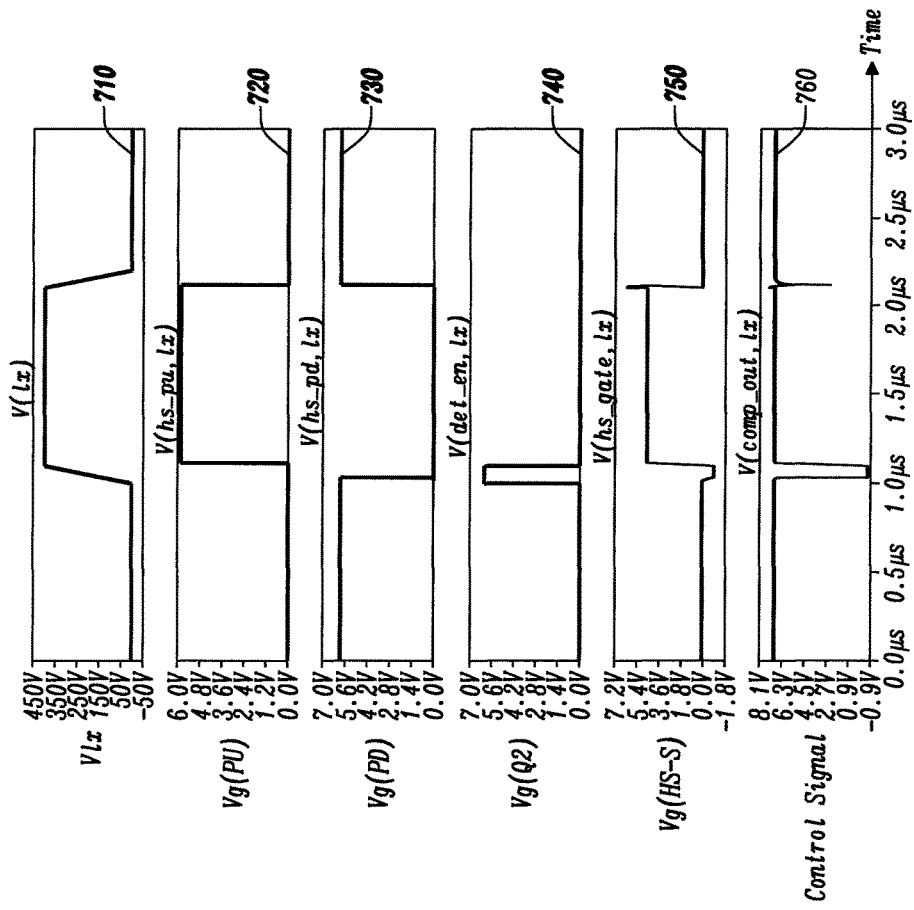
FIG. 7 is a timing diagram illustrating the working of the circuit of FIG. 6.

FIG. 7 is a time chart illustrating the working of the circuit of FIG. 6. The chart shows the voltage Vlx 710 at the switching node; the gate voltage 720 of the pull-up transistor 662; the gate voltage 730 of the pull-down transistor 664; the gate voltage 740 at the transistor Q2 644; the gate voltage 750 at the high-side power switch 210; and the output signal 760 provided by the comparator 640.

In operation, the transistor Q2 644 is turned on (closed) during the transient period, and turned off when the high-side power switch is on. Waveform 740 illustrates this behaviour. As a result, the sensing resistance R2 648, is only connected to the switching node for a short time necessary for sensing the voltage at the gate of the high-side power switch 210. This permits to reduce the deadtime while minimising power losses.

The circuits described above with reference to FIGS. 2, 4 and 6 are designed to detect a reduction in the gate voltage $V_G$ of a power switch, also referred to as negative ditch. However, it may also be possible to detect an increase in the gate voltage, also referred to as voltage peak.

Figure 8:
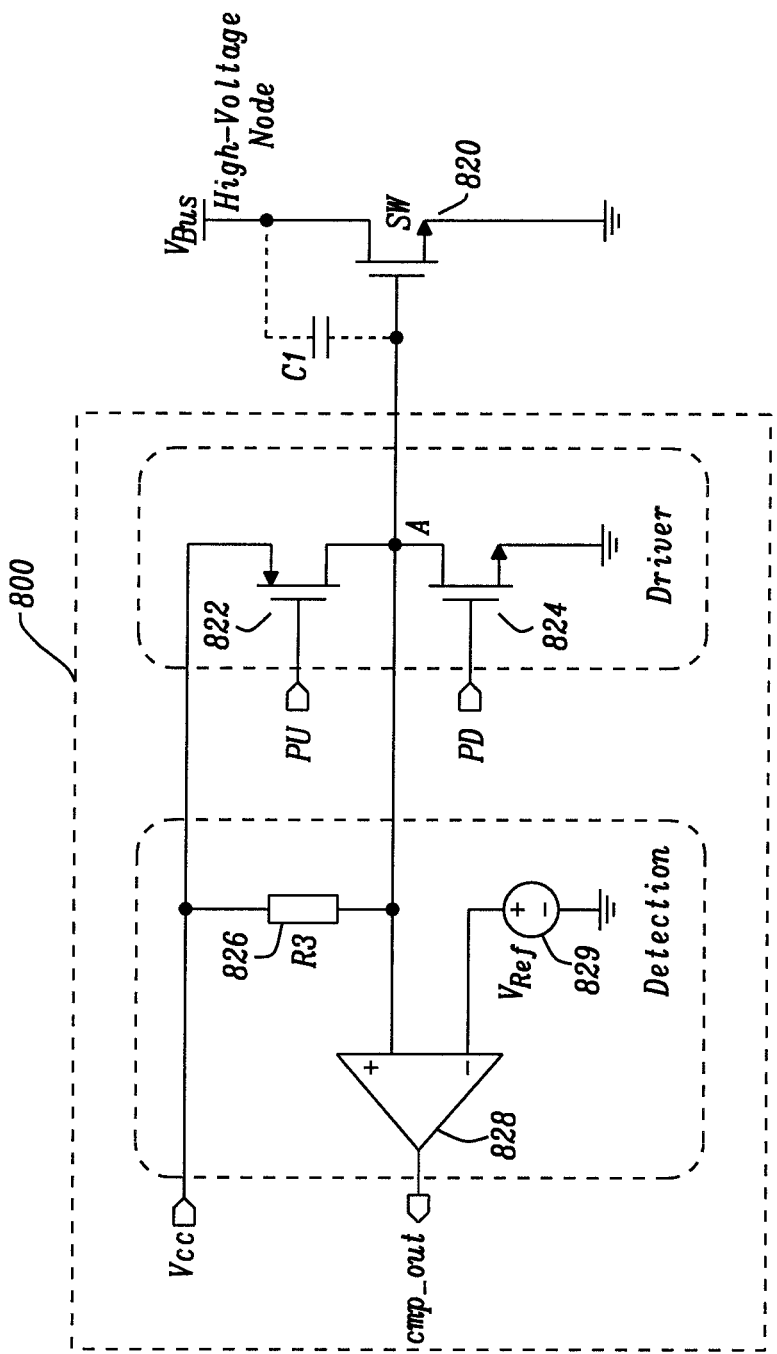
FIG. 8 is a circuit adapted to detect a voltage peak at the gate of a power switch.

FIG. 8 illustrates a circuit 800 adapted to detect a gate voltage $V_G$ of a power switch 820 that is greater than the reference voltage Vref. The power switch 820 has a gate terminal coupled to the circuit 800 at node A. The circuit 800 includes a driver coupled to a detector circuit. The driver is formed by a pull-up transistor 822 coupled to a pull-down transistor 824 at node A. The detector circuit includes a resistance R3 826; a comparator 828 and a voltage source 829 for providing a reference voltage Vref. The pull-up transistor 822 has a gate terminal; a drain terminal coupled to node A; and a source terminal coupled to the resistance R3 826. The pull up transistor 822 and the resistor 826 are coupled to a rail voltage Vcc. The comparator 828 has a non-inverting input coupled to the resistance R3 826; an inverting input coupled to the voltage source; and an output for providing a comparison signal to a controller (not shown).

Figure 9:
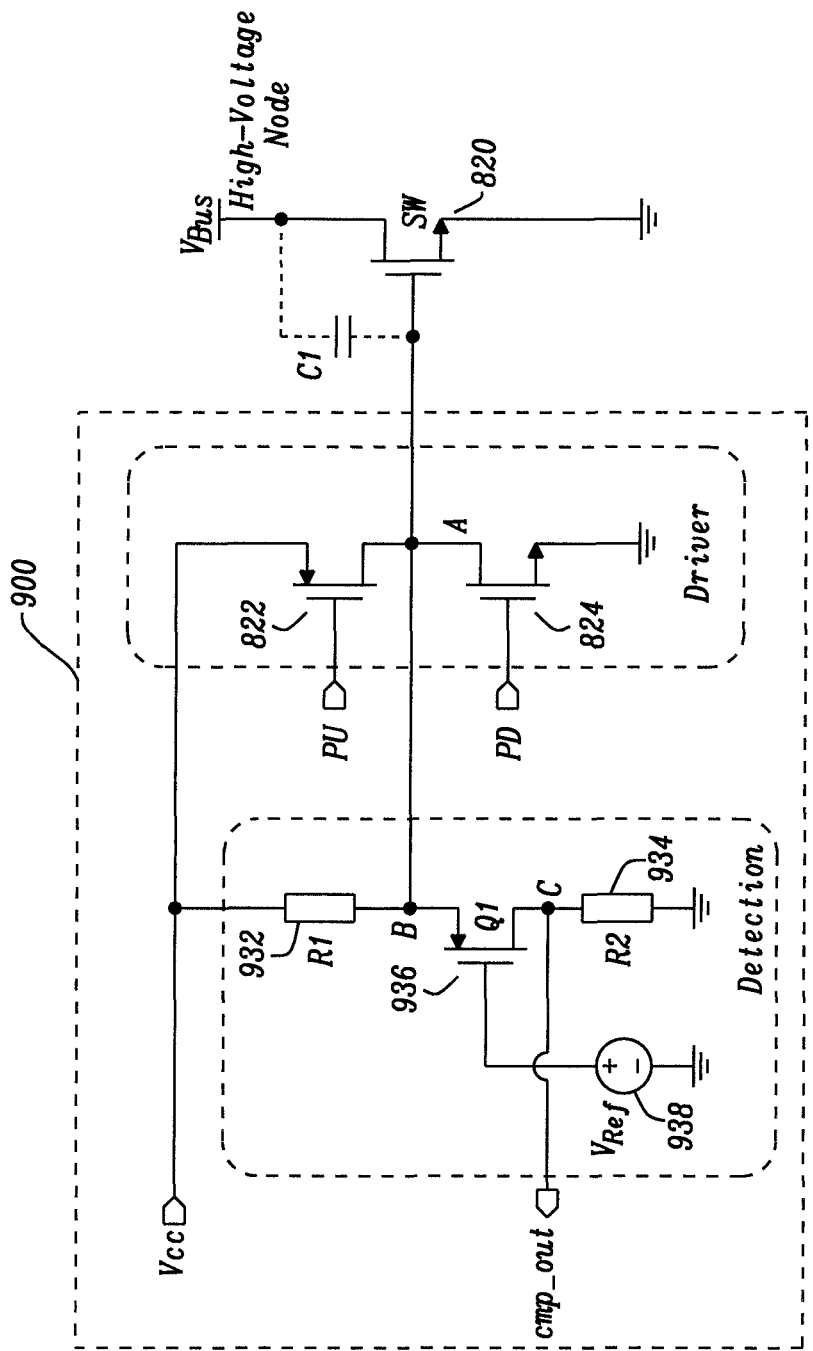
FIG. 9 is another circuit adapted to detect a voltage peak at the gate of a power switch.

FIG. 9 illustrates another circuit 900 adapted to detect a peak at the gate voltage of a power switch. FIG. 9 shares similar components to those illustrated in FIG. 8, so the same reference numerals have been used to represent corresponding components and their description will not be repeated for sake of brevity. In this example the detection circuit includes a first resistance R1 932, a second resistance R2 934, a transistor 936 and a voltage source 938. The transistor 936 has a source terminal coupled to the resistance R1 932 at node B, a gate terminal coupled to the voltage source 938 and a drain terminal coupled the resistance R2 934 at the output node C.

Any of the circuit described above with reference to FIGS. 2, 4, 6, 8 and 9 may be implemented wholly, or in part based on III/V semiconductors such as Gallium Nitride, GaN. Transistors based on III/V semiconductors such as Gallium Nitride, GaN, display a relatively low on-resistance and can achieve higher switching speed compared to their silicon-based counterpart. As such, GaN transistors are well suited for the design of fast power switching converters.

A skilled person will appreciate that variations of the disclosed arrangements are possible without departing from the disclosure. The circuits of FIGS. 2, 4, 6 are designed to sense the gate voltage of the high-side power switch to control the turn on of the high-side power switch; and to sense the gate voltage of the low-side power switch to control the turn on of the low-side power switch. The circuits of FIGS. 2, 4 and 6 may be modified to sense the gate voltage of the high-side power switch to control the turn on of the low-side power switch; and to sense the gate voltage of the low-side power switch to control the turn on of the high-side power switch. Accordingly, the above description of the specific embodiment is made by way of example only and not for the purposes of limitation. It will be clear to the skilled person that minor modifications may be made without significant changes to the operation described.

What is claimed is:

1. A method of driving a power stage comprising a first power switch coupled to a second power switch via a switching node; the method comprising:
   providing a first sensing resistance coupled to a control terminal of the first power switch and a second sensing resistance coupled to a control terminal of the second power switch;
   sensing a first control-terminal voltage of one of the first power switch and the second power switch, comparing the first control-terminal voltage with a first reference value and generating a first control signal based on the comparison to turn on the first power switch;
   sensing a second control-terminal voltage of one of the first power switch and the second power switch, comparing the second control-terminal voltage with a second reference value and generating a second control signal based on the comparison to turn on the second power switch.

2. The method as claimed in claim 1, wherein the first power switch is turned on when the first control-terminal voltage has reached a first threshold value; and wherein the second power switch is turned on when the second control-terminal voltage has reached a second threshold value.

3. The method as claimed in claim 1,
   wherein the first power switch comprises a first parasitic capacitor associated with a first parasitic current, and
   wherein the second power switch comprises a second parasitic capacitor associated with a second parasitic current.

4. The method as claimed in claim 3, wherein the first control-terminal voltage is a function of the first parasitic current and the first sensing resistance; and wherein the second control-terminal voltage is a function of the second parasitic current and the second sensing resistance.

5. The method as claimed in claim 3, wherein the switching node has a switching voltage; and wherein the first and second parasitic currents are function of a time derivative of the switching voltage.

6. The method as claimed in claim 1, wherein the switching node has a switching voltage that varies between a first value and a second value during a transient period; and wherein the first control-terminal voltage and the second control-terminal voltage are sensed at some point during the transient period.

7. A driver for use with a power stage, the power stage comprising a first power switch coupled to a second power switch via a switching node; the driver comprising a first sensing resistance coupled to a control terminal of the first power switch and a second sensing resistance coupled to a control terminal of the second power switch; the driver being adapted
   to sense a first control-terminal voltage of one of the first power switch and the second power switch, to compare the first control-terminal voltage with a first reference and to generate a first control signal based on the comparison to turn on the first power switch;
   to sense a second control-terminal voltage of one of the first power switch and the second power switch; to compare the second control-terminal voltage with a second reference and to generate a second control signal based on the comparison to turn on the second power switch.

8. The driver as claimed in claim 7, wherein driver is adapted to turn on the first power switch when the first control-terminal voltage has reached a first threshold value; and to turn on the second power switch when the second control-terminal voltage has reached a second threshold value.

9. The driver as claimed in claim 7,
   wherein the first power switch comprises a first parasitic capacitor associated with a first parasitic current, and
   wherein the second power switch comprises a second parasitic capacitor associated with a second parasitic current.

10. The driver as claimed in claim 9, wherein the first control-terminal voltage is a function of the first parasitic current and the first sensing resistance; and wherein the second control-terminal voltage is a function of the second parasitic current and the second sensing resistance.

11. The driver as claimed in claim 9, wherein the switching node has a switching voltage; and wherein the first and second parasitic currents are function of a time derivative of the switching voltage.

12. The driver as claimed in claim 7, further comprising:
    a first comparator to compare the first control-terminal voltage with the first reference and to provide a first comparison signal;
    a second comparator to compare the second control-terminal voltage with the second reference and to provide a second comparison signal;
    a controller coupled to the first comparator and the second comparator; the controller being adapted to provide the first control signal to turn the first power switch on and the second control signal to turn the second power switch on; wherein the first control signal is based on the first comparison signal; and wherein the second control signal is based on the second comparison signal.

13. The driver as claimed in claim 12, wherein the switching node has a switching voltage, the switching voltage increasing from a first value to a second value during a first transient period, and decreasing from the second value to the first value during a second transient period; and
    wherein the first comparator is adapted to compare the first control-terminal voltage with the first reference at some point during the first transient period; and
    wherein the second comparator is adapted to compare the second control-terminal voltage with the second reference at some point during the second transient period.

14. The driver as claimed in claim 12, wherein the first comparator comprises a first transistor coupled to the first reference; and wherein the second comparator comprises a second transistor coupled to the second reference.

15. The driver as claimed in claim 12, wherein the first comparator is coupled to the first sensing resistor; and wherein the second comparator is coupled to the second sensing resistor.

16. The driver as claimed in claim 15, wherein the first sensing resistor is provided between the switching node and a control-terminal terminal of the first power switch; and wherein the second sensing resistor is provided between a ground terminal and a control-terminal terminal of the second power switch.

17. A power circuit comprising:
    a power stage comprising a first power switch coupled to a second power switch via a switching node; and
    a driver, the driver comprising a first sensing resistance coupled to a control terminal of the first power switch and a second sensing resistance coupled to a control terminal of the second power switch; the driver being adapted
- to sense a first control-terminal voltage of one of the first power switch and the second power switch, to compare the first control-terminal voltage with a first reference and to generate a first control signal based on the comparison to turn on the first power switch;
- to sense a second control-terminal voltage of one of the first power switch and the second power switch, to compare the second control-terminal voltage with a second reference and to generate a second control signal based on the comparison to turn on the second power switch.

18. The power circuit as claimed in claim 17, wherein the power circuit is made at least in part of a III/V semiconductor.

19. The power circuit as claimed in claim 17,
- wherein the first power switch comprises a first parasitic capacitor associated with a first parasitic current, and
- wherein the second power switch comprises a second parasitic capacitor associated with a second parasitic current.

20. The power circuit as claimed in claim 19, wherein the first control-terminal voltage is a function of the first parasitic current and the first sensing resistance; and wherein the second control-terminal voltage is a function of the second parasitic current and the second sensing resistance.

21. The power circuit as claimed in claim 19, wherein the switching node has a switching voltage; and wherein the first and second parasitic currents are function of a time derivative of the switching voltage.

22. The power circuit as claimed in claim 17, wherein the driver comprises:
- a first comparator to compare the first control-terminal voltage with the first reference and to provide a first comparison signal;
- a second comparator to compare the second control-terminal voltage with the second reference and to provide a second comparison signal;
- a controller coupled to the first comparator and the second comparator; the controller being adapted to provide the first control signal to turn the first power switch on and the second control signal to turn the second power switch on; wherein the first control signal is based on the first comparison signal; and wherein the second control signal is based on the second comparison signal.

23. The power circuit as claimed in claim 22, wherein the switching node has a switching voltage, the switching voltage increasing from a first value to a second value during a first transient period, and decreasing from the second value to the first value during a second transient period; and
- wherein the first comparator is adapted to compare the first control-terminal voltage with the first reference at some point during the first transient period; and
- wherein the second comparator is adapted to compare the second control-terminal voltage with the second reference at some point during the second transient period.

* * * * *